(12) United States Patent
Plants

(10) Patent No.: US 6,838,899 B2
(45) Date of Patent: Jan. 4, 2005

(54) APPARATUS AND METHOD OF ERROR DETECTION AND CORRECTION IN A RADIATION-HARDENED STATIC RANDOM ACCESS MEMORY FIELD-PROGRAMMABLE GATE ARRAY

(75) Inventor: William C. Plants, Sunnyvale, CA (US)

(73) Assignee: Actel Corporation, Mountain View, CA (US)

( * ) Notice: Subject to any disclaimer, the term of this patent is extended or adjusted under 35 U.S.C. 154(b) by 48 days.

(21) Appl. No.: 10/335,234

(22) Filed: Dec. 30, 2002

(65) Prior Publication Data

US 2004/0124876 A1 Jul. 1, 2004

(51) Int. Cl.[7] .............................................. H03K 19/003
(52) U.S. Cl. ............................... 326/9; 326/10; 326/11; 326/38; 326/39
(58) Field of Search ............................ 326/9–12, 16, 326/38, 39, 14

(56) References Cited

U.S. PATENT DOCUMENTS

| | | | | |
|---|---|---|---|---|
| 4,876,220 A | | 10/1989 | Mohsen et al. ............. 437/170 |
| 6,104,211 A | * | 8/2000 | Alfke .......................... 326/91 |
| 6,237,124 B1 | * | 5/2001 | Plants ......................... 714/763 |
| 6,324,102 B1 | | 11/2001 | McCollum ............. 365/185.33 |
| 6,492,206 B2 | | 12/2002 | Hawley et al. ............. 438/131 |

* cited by examiner

Primary Examiner—Anh Q. Tran
(74) Attorney, Agent, or Firm—Sierra Patent Group, Ltd.

(57) ABSTRACT

The present system comprises a radiation tolerant programmable logic device having logic modules and routing resources coupling together the logic modules. Configuration data lines providing configuration data control the programming of the logic modules and the routing resources. Error correction circuitry coupled to the configuration data lines analyzes and corrects any errors in the configuration data that may occur due to a single event upset (SEU).

The present system also comprises a method for correcting errors in a programmable logic device having configuration data to program the programmable logic device. The method comprises a background reading of the configuration data. Next, the configuration data is analyzed for errors. Finally, the configuration data is then corrected and the configuration data is rewritten if errors are located.

10 Claims, 12 Drawing Sheets

APPARATUS AND METHOD OF ERROR DETECTION AND CORRECTION IN A RADIATION-HARDENED STATIC RANDOM ACCESS MEMORY FIELD-PROGRAMMABLE GATE ARRAY

BACKGROUND

1. Field of the System

The present invention relates to integrated circuits. In particular, the present invention relates to a method for error detection and correction in a radiation tolerant static random access memory (SRAM) for a field programmable gate array (FPGA).

2. Background

A major concern in building a radiation-hardened SRAM-based FPGA for a space application is the reliability of the configuration memory. Memory devices used in satellites and in other computer equipment, can be placed in environments that are highly susceptible to radiation. A satellite memory cell in a space environment can be exposed to a radiation-induced soft error, commonly called a single event upset (SEU), when a cell is struck by high-energy particles. Electron-hole pairs created by, and along the path of, a single energetic particle as it passes through an integrated circuit such as a memory typically cause a soft error or SEU. An SEU typically results from alpha particles (helium nuclei), beta particles or other ionized nuclei rays impacting a low-capacitance node of a semiconductor circuit. Should the energetic particle generate the critical charge in the critical volume of the memory cell, the logic state of the memory is upset. This critical charge, by definition, is the minimum amount of electrical charge required to change the logic state of the memory cell. It is commonly called Q Critical ($Q_{crit}$).

An SEU can change the contents of any volatile memory cell. If that bit of memory is doing something besides merely storing data, such as controlling the logic functionality of an FPGA, the results can be catastrophic. While other technologies may be better suited for the most sensitive control functions of a spacecraft, there is a significant advantage to be had by being able to change a portion of the spacecraft's functionality remotely, either during prototyping on the ground or later during the mission. Spacecraft designers accept the idea that SEUs will inevitably occur. Based on the inevitable, they are willing to use SRAM-based FPGAs in non-critical portions of the vehicle provided the error rate is reasonable, sufficient error trapping is available and the recovery time is reasonable.

When a heavy ion traverses a node within a memory storage cell, the ion can force the node from its original state to an opposite state for a period of time. This change of state is due to the charge that the heavy ion deposits as it passes through the silicon of the Metal Oxide Semiconductor (MOS) transistor of the memory cell. If this node is held in the opposite state for a period of time longer than the delay around the feed back loop of the memory cell, the cell can switch states and the stored data can be lost. The period of time the node is held in the opposite state can depend on several factors. The most critical being the charge deposited.

FIG. 1 a is a simplified schematic diagram of a logic gate 104. Logic gate 102 comprises a p-channel transistor 102 and an n-channel transistor 100. P-channel transistor has a source coupled to Vcc, a drain coupled to node Q 105 and a gate coupled to node QB 106. N-channel transistor 100 has a source coupled to ground, a drain coupled to Q node 105 and a gate coupled to QB node 106.

FIG. 1b is an illustration of a charged particle strike on transistor 100. Transistor 100 comprises a drain 160, a source 165 and a gate 162. Gate oxide 163 separates gate 162, drain 160 and source 161. As shown in FIG. 1b the drain 160 is being struck by the charged particle (ion) 110 along the strike path 180. When the charged particle 110 tears though a semiconductor transistor 100 (potentially at relative velocities of 10,000 miles per hour or more), it leaves a wake of hole and electron pairs 120 behind. If it strikes the output diffusion of a Complementary Metal Oxide Semiconductor (CMOS) logic gate 104, as illustrated in FIG. 1a, all of those carriers are available as drift current 130 if an electric field is present. If no electric field is present then the drift current 130 ultimately diffuses. If the output of the CMOS gate is not at the voltage of the surrounding material of the diffusion that is struck (for example, N+ diffusion 160 at Vcc in a P-substrate 190 at ground), then such an electric field exists and the current will pull that diffusion towards the voltage of the P-substrate 190. Problems occur from a strike to the N+ diffusion 140 of a gate 162 is driven to Logic-1 or the P+ diffusion of a gate is driven to Logic-0.

In such an occurrence, there are two sources of current vying for control of the node Q: the CMOS p-channel device 102 (shown in FIG. 1a) that originally drove the node to the correct logic level and the pool of charge in the so-called "field funnel" 150 in FIG. 1b. The larger current controls the node. If the strength of p-channel device 102 is large relative to the available drift current 130, then the node will barely move. If the strength of p-channel device 102 is small relative to the energy strike, then the drift current 130 in FIG. 1b controls. Drift current 130 controls until all its charge dissipates, at which time the CMOS device can restore the node to the correct value.

Unfortunately, it takes time for a small CMOS device to regain control against a high-energy strike. In the case, for example, of a victimized gate being part of the feedback path in a sequential (i.e. memory) element with the incorrect logic level propagating around the loop, the CMOS device gets shut off and is never able to make the needed correction and the memory element loses state. If the memory element controls something important, system or subsystem failure can result.

FIG. 2a is a simplified schematic diagram illustrating a particle strike on cross-coupled transistors. Transistors 102a, 102b, 100a and 100b are identical to two logic gates as shown as one logic gate 104 in FIG. 1a. In FIG. 2a, particle strike 210 is shown hitting the N+ region of n-channel transistor 100a. FIG. 2b illustrates the waveform associated with this strike.

FIG. 2b is a diagram depicting the waveforms 200 associated with a particle strike 210. The particular case shown is for a particle not quite capable of producing the critical charge required to flip the latch. At time T1, the particle hits and then node Q drops from its equilibrium value of Vcc very quickly due to the drift in the field funnel. Meanwhile, transistor 102 feeding node Q pumps current into node Q at T2, when all the charge in the field funnel 150 in FIG. 1b is exhausted, node Q quickly returns to its original equilibrium value of Vcc. Since the case depicted is close to the maximum amount of charge that the cell can withstand, the voltage on node Q approaches the trip point 230 at $V_{trip}$. If the charged particle had created substantially more charge carriers than the transistor could have overcome, then node Q would have dropped to ground potential and the latch would have flipped into the opposite state permanently.

SRAM in an FPGA may also be specified as CSRAM or USRAM. CSRAM is Configuration SRAM. This CSRAM is used to hold the configuration bits for the FPGA. It is physically spread out over the entire die and is interspersed with the rest of the FPGA circuitry. At least one of the two nodes in the static latch that make up the SRAM cell can be connected to the FPGA circuitry that controls it. When the contents of the CSRAM change, the logic function implemented by the FPGA changes. What is needed is a solution to insure the data integrity is maintained.

USRAM is the abbreviation for user SRAM. This is memory that is part of a user logic design and is concentrated inside a functional block dedicated to the purpose. What is needed is a solution to insure the data integrity of an USRAM is maintained.

In an SRAM based FPGA, there are a variety of separate elements that go into the making of a useful product. There are configuration memory bits in the CSRAM, which allow the user to impose his/her design on the uncommitted resources available. There are the combinational and sequential modules that do the user's logic. There are the configurable switches, signal lines, and buffers that allow the modules to be connected together. There are support circuits like clocks and other global signals like enables and resets, which allow the building of one or more subsystems in different time domains. There are blocks like the SRAM and DLL that allow the user access to more highly integrated functions than can be built out of an array of logic modules and interconnect.

Hence, there is a need for an apparatus and method of providing error detection and correction in a radiation-hardened SRAM based FPGA, which can easily be implemented using conventional CMOS processes, and which has performance speed comparable to an SRAM based FPGA that has not been radiation-hardened.

SUMMARY OF THE INVENTION

The present system comprises a radiation tolerant programmable logic device having logic modules and routing resources coupling together the logic modules. Configuration data lines providing configuration data control the programming of the logic modules and the routing resources. Error correction circuitry coupled to the configuration data lines analyzes and corrects any errors in the configuration data that may occur due to a single event upset (SEU).

The present system also comprises a method for correcting errors in a programmable logic device having configuration data to program the programmable logic device. The method comprises a background reading of the configuration data. Next, the configuration data is analyzed for errors. Finally, the configuration data is then corrected and the configuration data is rewritten if errors are located.

A better understanding of the features and advantages of the present invention will be obtained by reference to the following detailed description of the invention and accompanying drawings which set forth an illustrative embodiment in which the principles of the invention are utilized.

DETAILED DESCRIPTION OF THE INVENTION

The preferred embodiment of the invention is discussed in detail below. While specific implementations are discussed, it should be understood that this is done for illustration purposes only. A person skilled in the relevant art will recognize that other components and configurations may be used without parting from the spirit and scope of the invention.

In this disclosure, various circuits and logical functions are described. It is to be understood that designations such as "1" and "0" in these descriptions are arbitrary logical designations. In a first implementation of the invention, "1" may correspond to a voltage high, while "0" corresponds to a voltage low or ground, while in a second implementation, "0" may correspond to a voltage high, while "1" corresponds to a voltage low or ground. Likewise, where signals are described, a "signal" as used in this disclosure may represent the application, or pulling "high" of a voltage to a node in a circuit where there was low or no voltage before, or it may represent the termination, or the bringing "low" of a voltage to the node, depending on the particular implementation of the invention.

The disclosed invention relates to a method for designing a radiation-hardened FPGA and the required circuit designs for conversion from a commercial Static Random Access Memory (SRAM) based Field Programmable Gate Array (FPGA) to a radiation-hardened version. The radiation-hardened FPGA described herein greatly reduces the (Single Event Upset) SEU issues associated with prior-art devices.

Since radiation-hardened circuits tend to be rather large relative to their non-radiation hardened counterparts, making all parts of the circuit hard is not practical due to area considerations. A method is needed to prioritize the need for radiation hardness of the various items and only implement the essential items radiation hardened circuits. Radiation-hardened design is very much a statistical approach.

Described below is the approach used to create a radiation-hardened FPGA.

The CSRAM must be hardened since the product may not be commercially viable unless the part can reliably store the logic design. Also, it should be done in an extremely area efficient way since there are millions of configuration bits which comprise about 25% of the core area. A background READ\READ\READ\WRITE on error scheme with the Error Correction Code (ECC) bits to ensure the data is kept accurate is employed.

The configuration data input circuitry, the read or write systems, and the CSRAM wordline driver/decoder and associated control logic will be required to be hardened, since they control the memory loading and background checking.

Figure 1A:
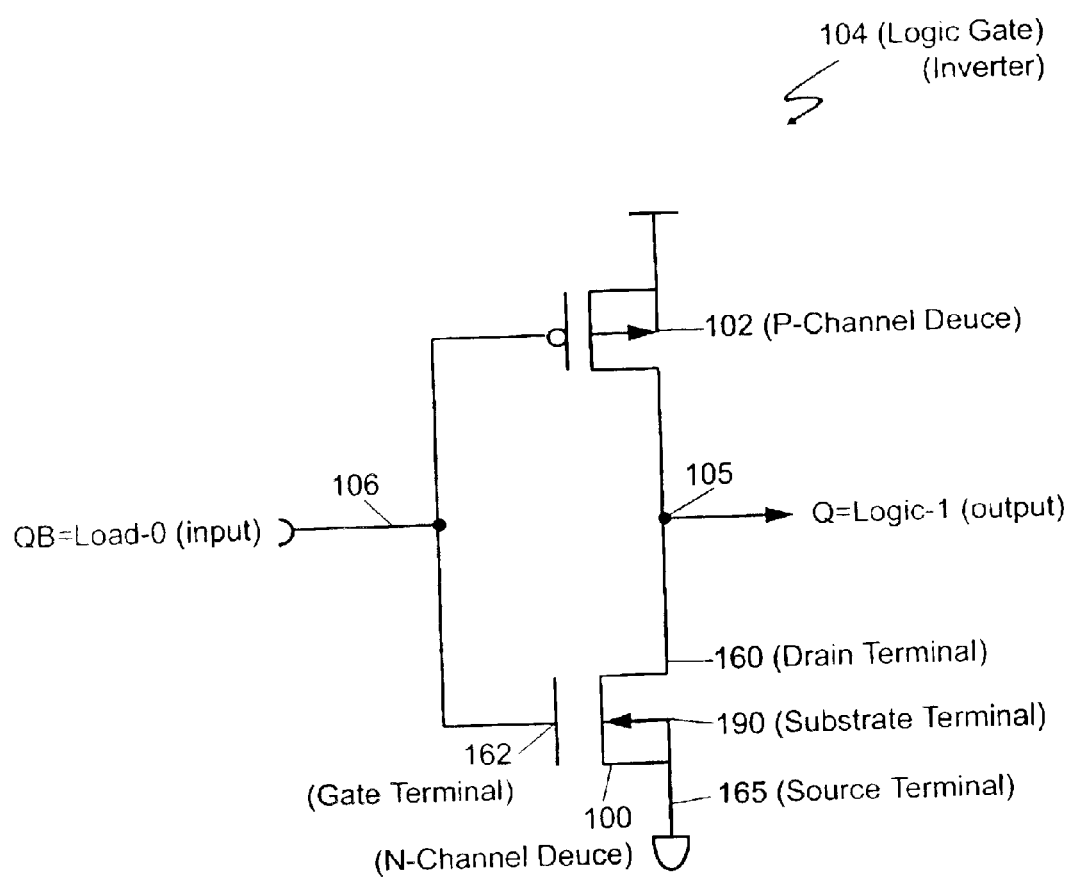
FIG. 1a is a simplified schematic diagram of a logic gate.
Figure 1B:
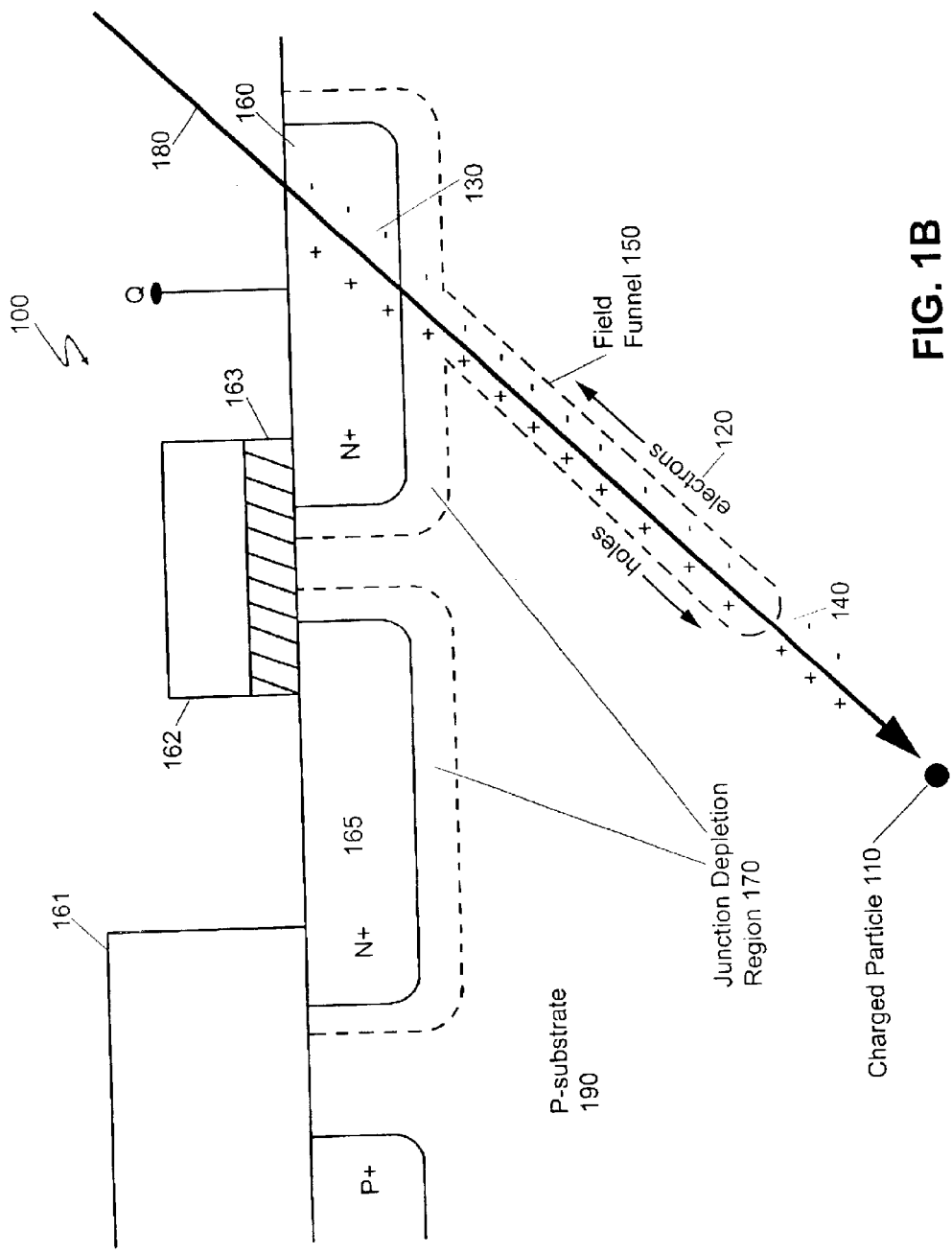
FIG. 1b is an illustration of a charged particle strike though a semiconductor and creating a wake of hole and electron pairs.
Figure 2A:
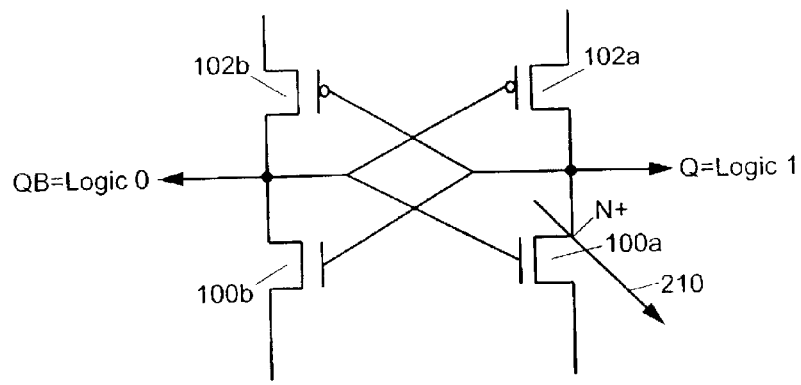
FIG. 2a is a simplified schematic diagram illustrating a particle strike on cross-coupled transistors.
Figure 2B:
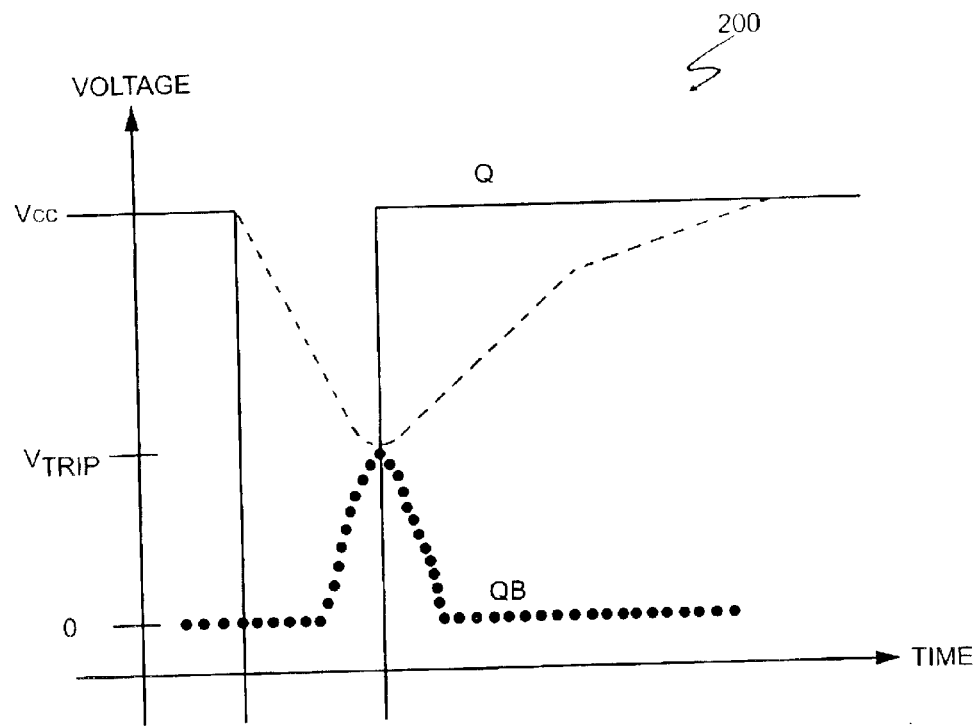
FIG. 2b is the waveform associated with a particle not quite capable of producing the critical charge required to flip a latch.
Figure 3:
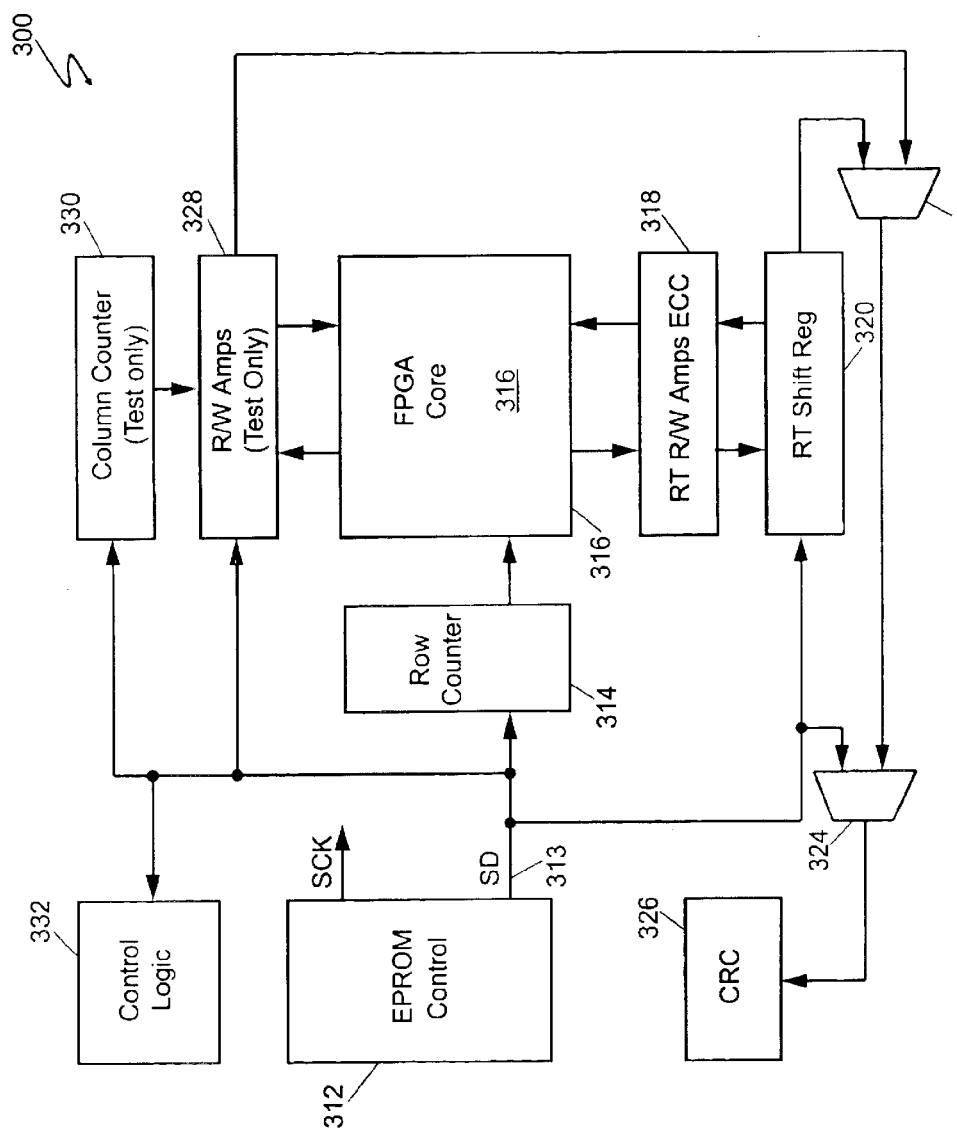
FIG. 3 is a simplified schematic diagram illustrating SRAM memory architecture having radiation tolerant reading and writing circuits as disclosed in the present invention.

FIG. 3 is a simplified schematic diagram illustrating CSRAM architecture 300 having radiation tolerant reading and writing circuits as disclosed in the present invention. SRAM memory architecture comprises an EPROM control block 312 that, as is well known to those of ordinary skill in the art, outputs a serial data stream (SD) from an external source (i.e., EPROM, CPU, etc.) and a corresponding clock signal (SCK) to synchronize the operations of the various blocks. The data stream includes a preamble that tells the various blocks how to process the rest of the data. The preamble may contain information such as partial load versus full load or partial load address, among other possibilities. The serial data stream signal is coupled to row counter 314 through signal line 313, control logic 332, column counter 330 and READ/WRITE amplifiers 328 (used during testing only). Row counter 314 is coupled to FPGA core 316. As is well known to those of ordinary skill in the art, an FPGA core may be employed as a stand-alone FPGA core, repeated in a rectangular array of core tiles, or included with other devices in a system-on-a-chip (SOC). The core FPGA tile may include an array of logic modules surrounded by input/output modules. An FPGA core tile may also include other components such as read only memory (ROM) modules. Horizontal and vertical routing channels provide interconnections between the various components within an FPGA core tile. Programmable connections are provided by programmable elements between the routing resources.

Column counter 330 is coupled to FPGA core 316 through READ/WRITE amplifiers 328. FPGA core 316 is coupled to radiation tolerant READ/WRITE amplifier and error correction code circuit 318 which is then coupled to the cyclic redundancy check circuit (CRC) 326 through radiation tolerant shift register 320 and two-input multiplexers 322 and 324. Radiation tolerant READ/WRITE amplifier and error correction code circuit 318 and radiation tolerant shift register along with row counter 314 perform background error correction code refresh operations.

Row counter 314 raises the word of any row only if every cell in the row is to be accessed for reading or writing and leaves the word low (and the memory cells protected) the rest of the time. To accomplish this, the radiation tolerant shift register 320 and radiation tolerant READ/WRITE amplifier and error correction code circuit 318 of the present invention have been added to load the data into the circuit in a radiation environment.

Figure 4:
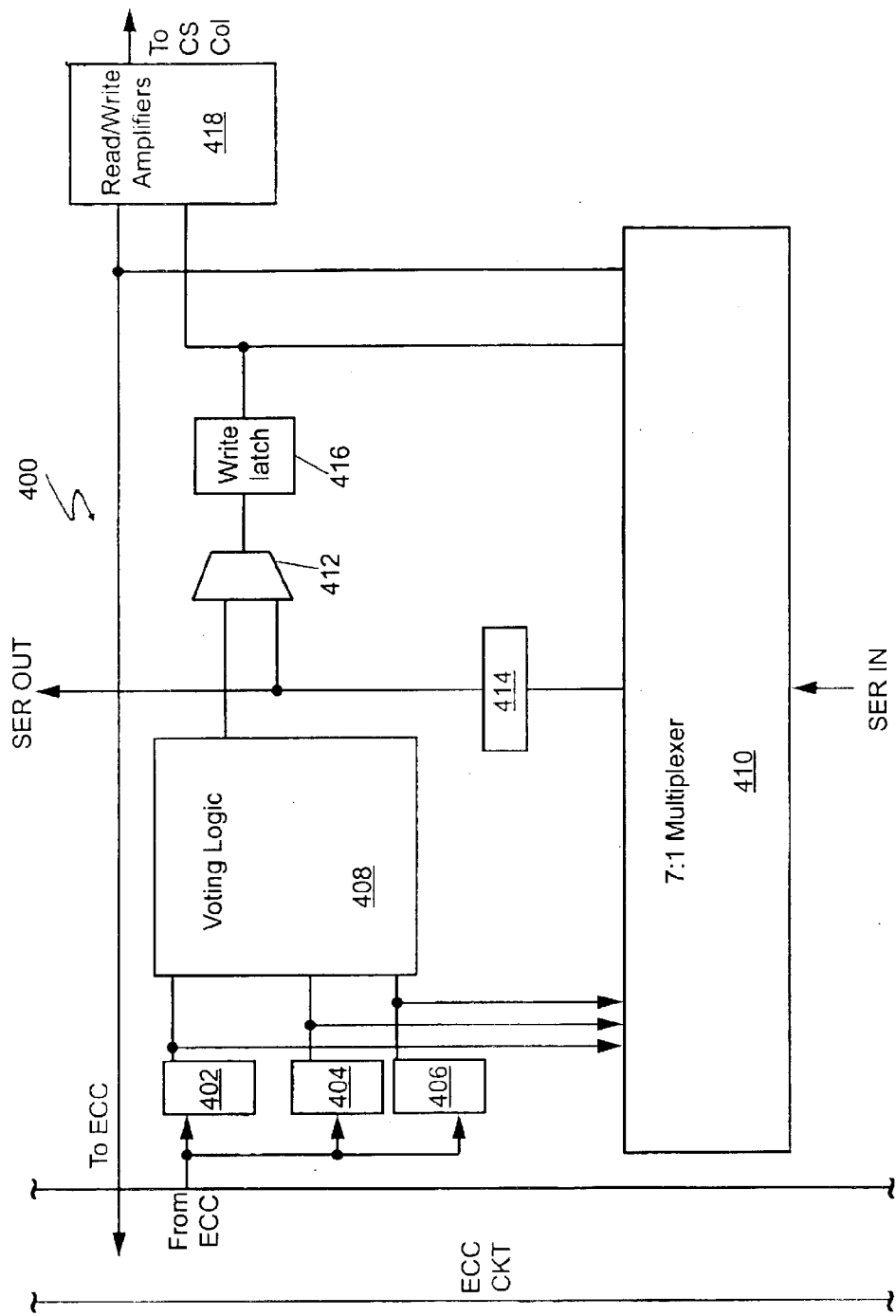
FIG. 4 shows a simplified block diagram of CSRAM interface circuit.

FIG. 4 shows a simplified block diagram of one bit 400 of radiation tolerant amplifier and error correction code circuit 318 and radiation tolerant shift register 320. CSRAM interface circuit 400 interfaces between each memory column in the CSRAM core and the ECC circuitry. CSRAM interface circuit 400 comprises a plurality of ECC latches, in this illustrative example there are three 402, 404 and 406. ECC latches are coupled to a majority of three voting block 408. Voting block also has inputs coupled to 7:1 multiplexer 410. Multiplexer 410 sources the shift register of flip-flop 414 discussed below. The output of voting block 408 is coupled to one input of two-input multiplexer 412 which has a second input coupled to 7:1 multiplexer 410 through flip-flop 414. The shift register flip-flop 414 is one bit of radiation tolerant shift register 320 as shown in FIG. 3. Flip-flop 414 may be used to load data into the CSRAM, but may also be used in conjunction with 7:1 multiplexer 410 to observe the rest of the circuits in CSRAM interface circuit 400 for test purposes. The output of two-input multiplexer 412 is coupled to READ/WRITE amplifier 418 through a write latch 416. Two-input multiplexer 412 allows for sourcing of the write data from either the ECC or shift register flip-flop 414.

Figure 6:
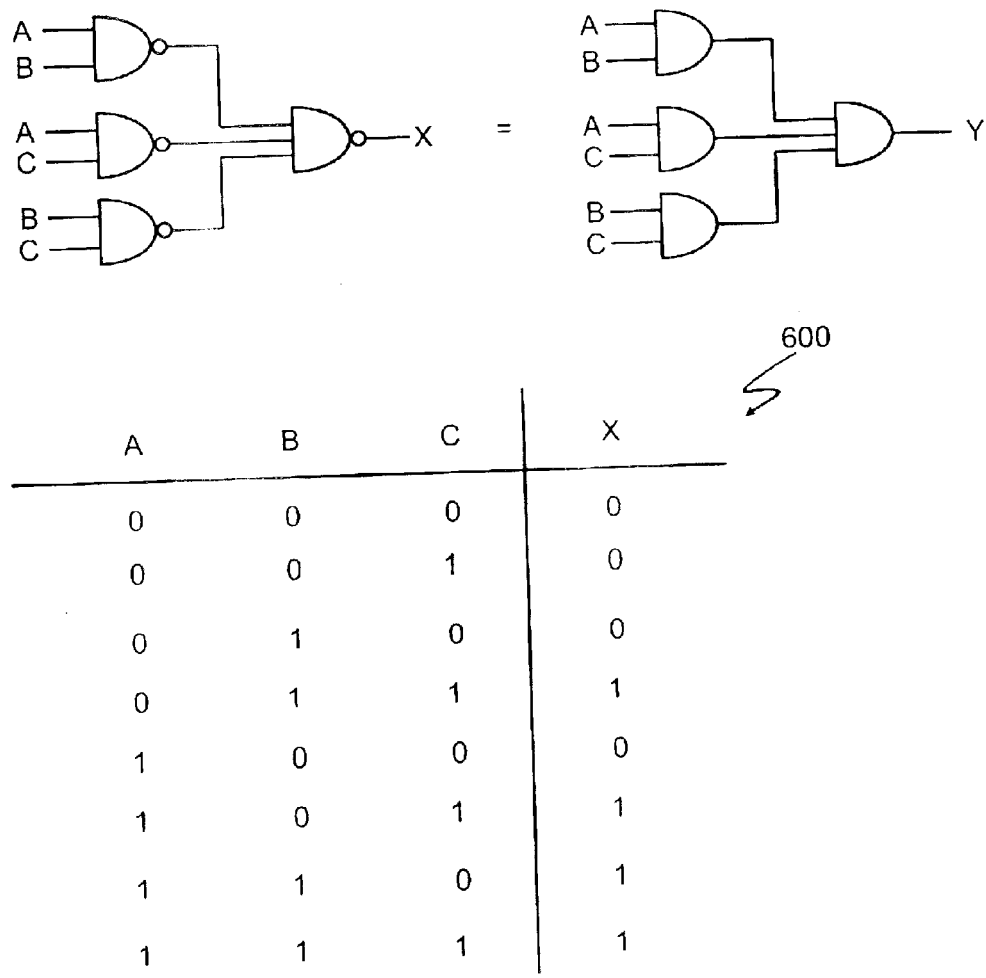
FIG. 6 illustrates the logic diagram and truth table for the majority of three voting circuit of FIG. 4.

ECC latches 402, 404 and 406 implement a triple-mode redundancy (TMR) for the results of the ECC circuitry. In the present invention, as will be discussed in greater detail below, the background ECC checking employs four cycles: three consecutive read cycles followed by a write cycle (even though a write operation will only occur during the write cycle when a correction is necessary). After each read cycle the results of the CRC check are stored in one of the radiation tolerant ECC latches 402, 404 or 406. Radiation tolerant ECC latches 402, 404 or 406 are identical to radiation tolerant write latch 416. Thus, the check is run through three times and the results are voted on a bit-by-bit basis in majority of three voting block 408. The voting logic is illustrated in FIG. 6.

Figure 5:
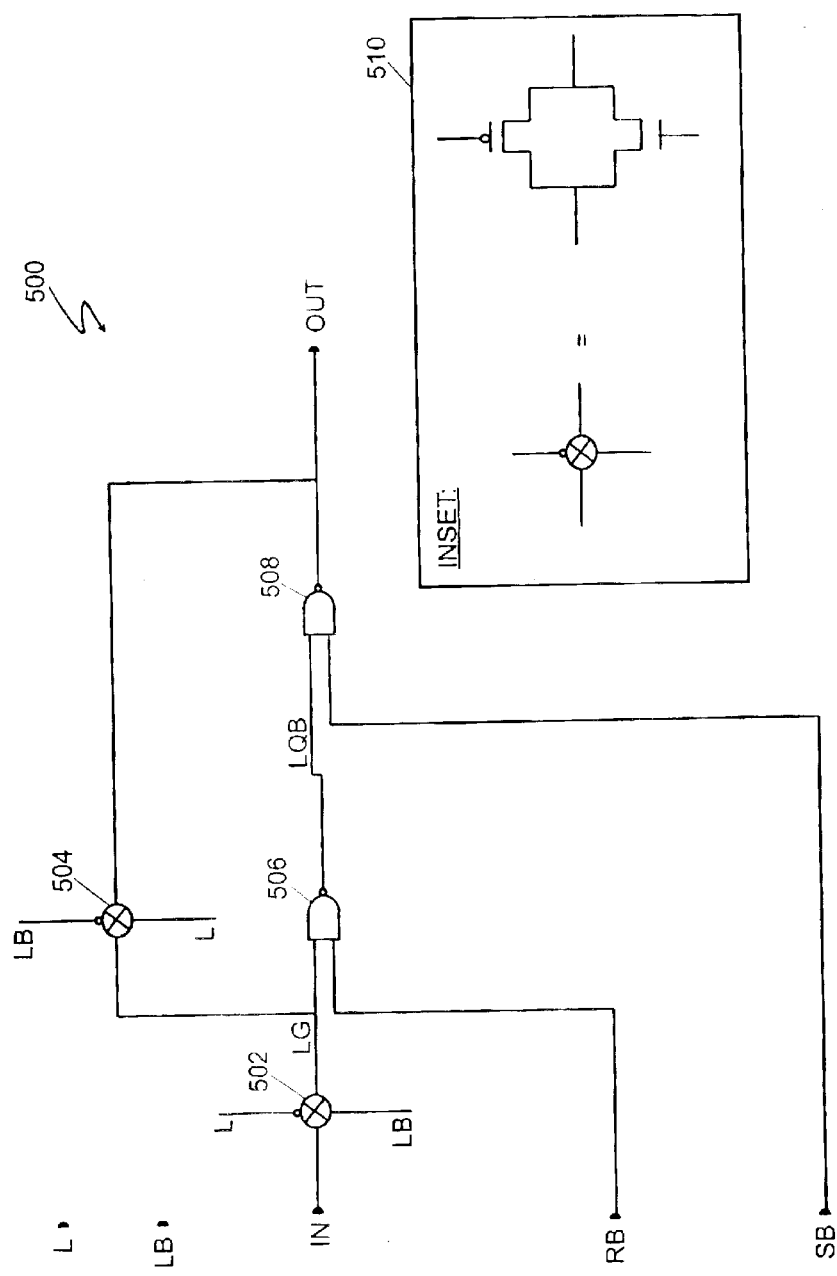
FIG. 5 is a simplified schematic diagram of a radiation hardened latch shown as ECC latches and write latch in FIG. 4.

FIG. 5 is a simplified schematic diagram of a radiation hardened latch 500 shown as ECC latch 402, 404, and 406 and write latch 416 in FIG. 4. Radiation hardened latch 500 is used to reliably hold the data being written into the CSRAM. Latch 500 operates normally as a CMOS, level sensitive, asynchronous set/reset latch except that transistors in the feedback loop from 508 to 504 to 506 are larger than the minimum the process allows to make it radiation tolerant. The size of the transistor is determined by the size needed to resist a Qcrit or larger particle strike without the use of poly resistors. During operation, when L is high and LB is low, the left transmission gate 502 is closed and the right transmission gate 504 is open so the latch ignores input IN and the feedback loop from OUT to LG to LQB stores the data. When L is low and LB is high, the top transmission gate is off (breaking the feedback loop) and the left transmission gate is open making latch 500 responsive to the data on IN. The circuit for the transmission gate is illustrated in inset 510.

ECC latches 402, 404 and 406, as shown in FIG. 4, implement a triple-mode redundancy (TMR) for the ECC circuitry. In the present invention, as will be discussed in greater detail below, the background ECC checking employs four cycles: three consecutive read cycles followed by a write cycle (even though a write operation will only occur during the write cycle when a correction is necessary). After each read cycle the results of the CRC check are stored in one of the radiation tolerant ECC latches 402, 404 or 406. The radiation tolerant ECC latches 402, 404 or 406 are identical to radiation tolerant write latch 416. The check is run through, for example, three times and the results are voted on a bit-by-bit basis in majority of three voting block 408. The voting logic is illustrated in FIG. 6.

In one embodiment of the present invention, only a single error correction scheme may be used, thus it is important that the error correction code circuit is designed such that there will be one error to correct in any ECC word line. However in some cases, errors referred to as "double strike" errors occur. These errors occur when a particle hits a circuit at a relatively shallow angle, upsetting two or more programming bits in a single word line simultaneously. In the ECC circuit of the present invention, the "double strike" problem is solved by physically separating the bits in any ECC word line by a distance larger than the "double strike" distance. Though the "double strike" distance is an estimate, it is believed to be approximately 20 um in a 0.25 mm CMOS process. In the present embodiment, the memory cell size in a first dimension (parallel to the word lines) may be approximately 7.66 um. Thus, three memory cells span a greater distance than the 20 um in a first dimension and that memory cells four or more places apart on a word line are insulated from "double strikes." In addition, there is almost always FPGA circuitry distributed among the memory columns such that the distance is usually greater than the above distances. Thus, in one embodiment of the present invention, four ECC word lines are interdigitated at one so that all the bits on any single word line are guaranteed to be more than the "double strike" distance apart. Because space on any integrated circuit is crucial, it is desirable to implement the FCC scheme of the present invention using data word lines as wide as possible. An example of an embodiment of this scheme is shown in FIG. 6 below.

Figure 7:
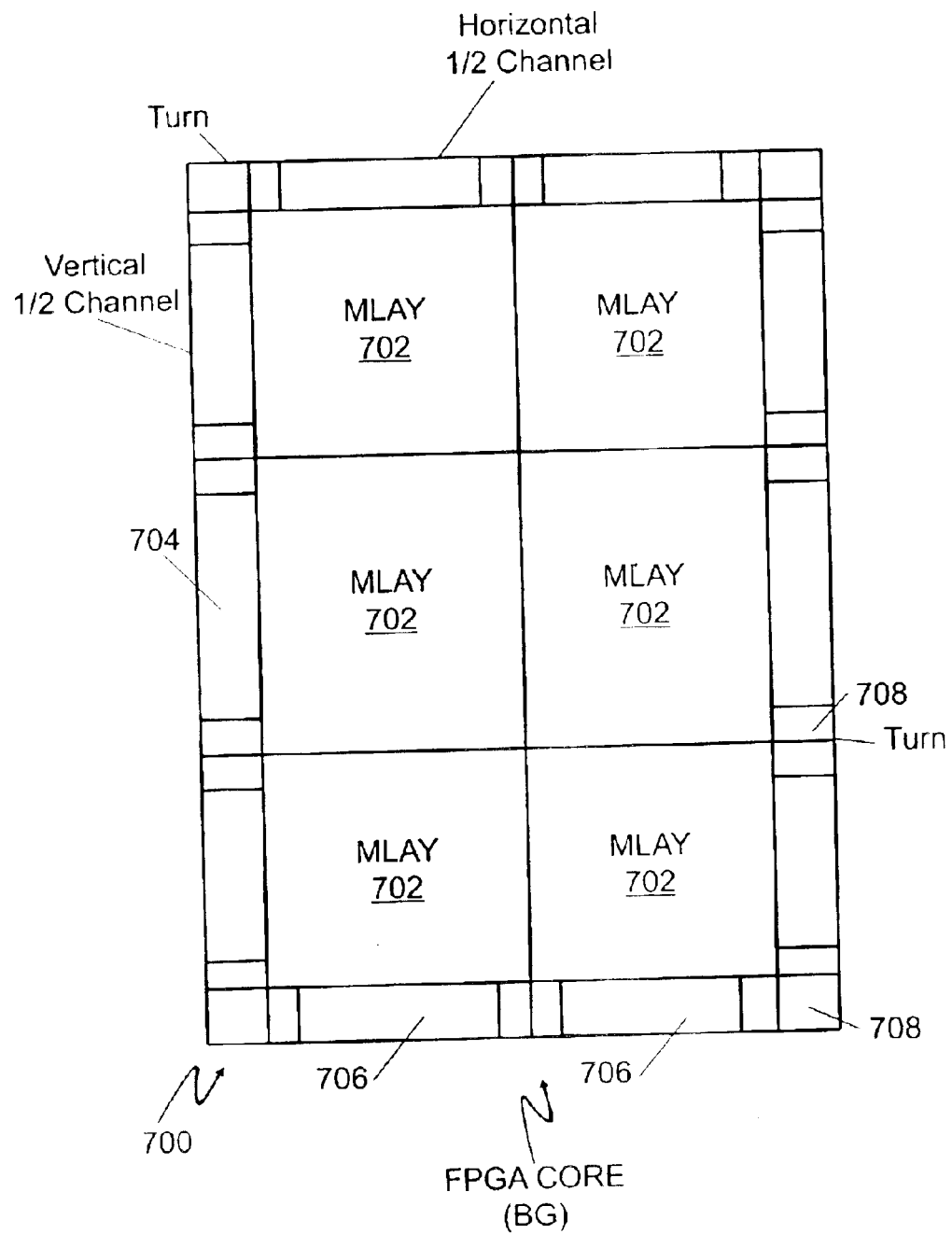
FIG. 7 is a simplified block diagram of a field programmable gate array (FPGA) core within an integrated circuit having multiple core tiles.

FIG. 7 is a simplified block diagram of a field programmable gate array (FPGA) core 700 within an integrated circuit having multiple core tiles 702. As set forth above, an FPGA core 700 may be employed as a stand-alone FPGA core, repeated in a rectangular array of core tiles, or included with other devices in a system-on-a-chip (SOC). The core FPGA tile may include an array of logic modules surrounded by input/output modules. An FPGA core tile may also include other components such as read only memory (ROM) modules. Horizontal and vertical routing channels provide interconnections between the various components within an FPGA core tile. Programmable connections are provided by programmable elements between the routing resources. In this illustrative example FPGA core 700 comprises six FPGA tiles 702. It will be clear to those of ordinary skill in the art having the benefit of this disclosure that other configurations are possible and the present configuration is set forth as an example only. FPGA core 600 also comprises horizontal half channel FPGA tiles 706, vertical half channel FPGA tiles 704 and turn blocks 708.

Figure 8:
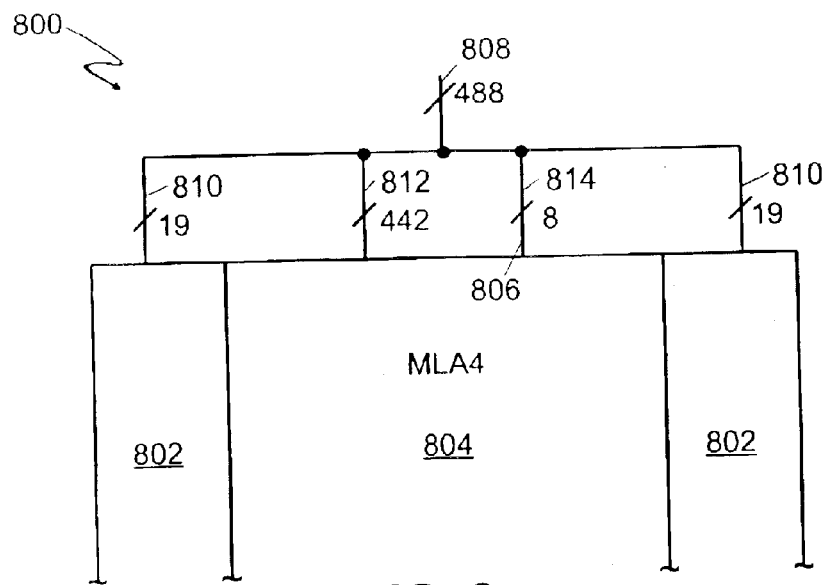
FIG. 8 is a simplified schematic diagram illustrating an FPGA core having only one core tile.

FIG. 8 is a simplified schematic diagram illustrating an FPGA core 800 having only one core tile 804. FPGA core 800 comprises two vertical half channels 802 each having 19 memory columns 810, one core tile 804 having 442 memory columns 812 and an additional 8 memory columns 814 for the internal ECC user SRAM (USRAM) circuit. The internal ECC user SRAM (USRAM) circuit will be discussed in greater detail below. CSRAM block 800 has total number of 488 memory columns.

As stated above, in one embodiment of the present invention, four ECC words are interdigitated on each word line so that all the bits in any single word line are guaranteed to be more than the "double strike" distance apart. In one illustrative embodiment, the total number of memory columns is 488, thus, in this embodiment, four ECC decoder/encoders that can accept a 122-bit data word line (488/4=122). As is well known to those of ordinary skill in the art, EGG uses hamming encode/decode with parity. In one example, to implement a single error correction/double error detection (SECDED) scheme (as shown in FIG. 4), 9 extra bits are required per data word line, or 9×4=36 additional bits per memory block.

Figure 9:
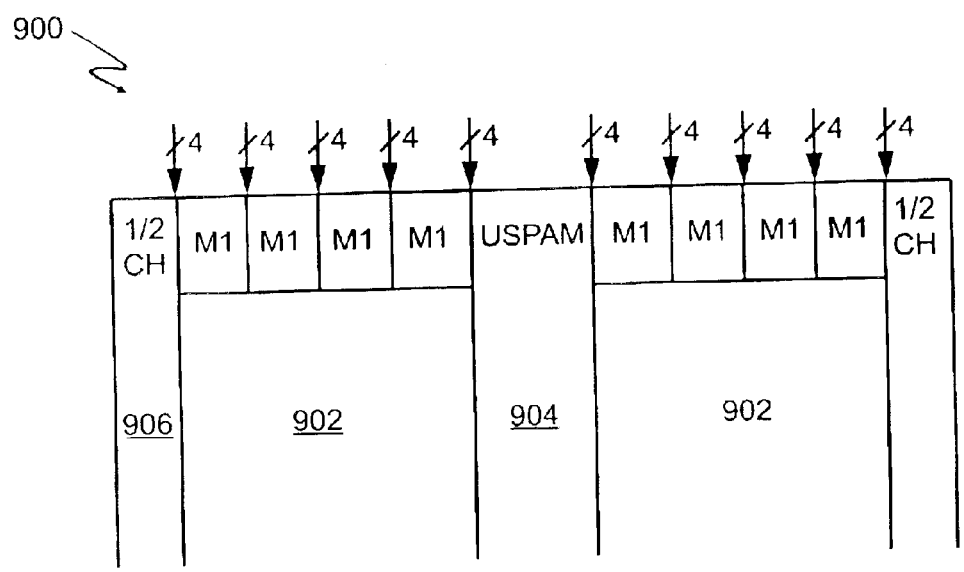
FIG. 9 is a simplified block diagram illustrating one embodiment of the placement of EEC check bits in a FPGA core having two FPGA tiles.

To spread out the delays for the FPGA routing resources, it is desirable to distribute the 36 check bits in groups of four (one bit for each ECC word line) over the width of FPGA core 902 as illustrated in FIG. 9. Each FPGA core 902 is associated with 4 check bits and the left vertical half channel 906 has 4 check bits. One of ordinary skill in the art having the benefit of this disclosure would realize that the above number of data bits, word lines and check bits may change according to a variety of factors including, but not limited to, FPGA core size. Thus, the above number of data bits, word lines and check bits are set forth for illustrative purposes only and are in no way meant to limited the present invention.

Figure 10:
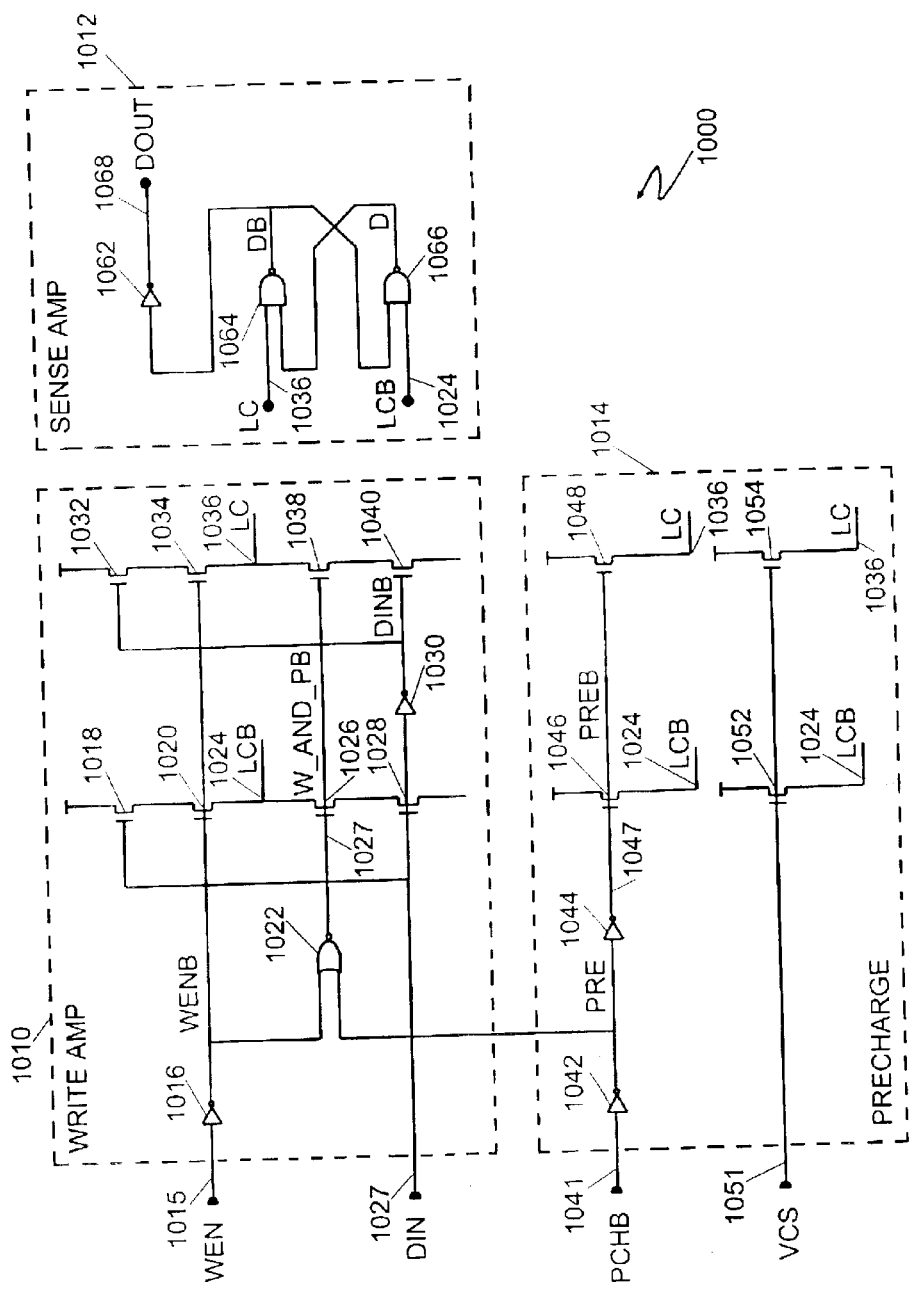
FIG. 10 is a simplified schematic diagram illustrating in greater detail the radiation tolerant read and write amplifiers for configuration static random access as shown in FIG. 4.

FIG. 10 is a simplified schematic diagram illustrating in greater detail the read and write amplifiers as shown in FIG. 4. Write amplifier 1010 comprises an enable input 1015 coupled to an inverter 1016. Inverter 1016 has an output coupled to the gate of P-channel transistors 1020 and 1034 and to two-input NOR gate 1022. Two-input NOR gate 1022 has a second input coupled to a first input 1041 of precharge circuit 1014 through inverter 1042 and an output coupled to the gate of N-channel transistors 1026 and 1038. Write amplifier 1010 has a data input 1027 coupled to the gates of P-channel transistors 1018, 1032 and N-channel transistors 1028 to 1032 and 1040 through inverter 1030. Data input 1027 of write amplifier 1010 is coupled to write latch 416 of FIG. 4.

Referring still to FIG. 10, P-channel transistor 1018 has a source coupled to Vcc and a drain coupled to the source of P-channel transistor 1020. P-channel transistor has a drain coupled to node comprising an output 1024. N-channel transistor 1026 has a drain coupled to node comprising an output 1024 and a source coupled to the drain of N-channel transistor 1028 that has a source coupled to ground. P-channel transistor 1032 has a source coupled to Vcc and a drain coupled to the source of P-channel transistor 1034. P-channel transistor has a drain coupled to node comprising a logic column bar (LCB) output 1036. N-channel transistor 1038 has a drain coupled to node comprising an output 1036 and a source coupled to the drain of N-channel transistor 1040 that has a source coupled to ground.

Precharge circuit 1014 comprises a precharge input 1041 coupled to inverter 1042. Inverter 1042 has an output coupled to an input of inverter 1044 which has an output coupled to the gate of P-channel transistors 1046 and 1048. P-channel transistor 1046 has a source coupled to Vcc and a drain coupled to LCB output 1024. P-channel transistor 1048 has a source coupled to Vcc and a drain coupled to logic column (LC) output 1036.

Precharge periods occur between all read and write operations. For example, precharge input 1041 may be at logic 0 during precharging. When precharge input 1041 is at logic 0, the input of inverter 1044 is at logic 1 which forces node 1047 to logic 0 and disables write circuit 1010 pull-down transistors 1026 and 1038. When precharge input 1041 is at logic 0, it also forces node 1047 to logic 0 turning on the precharge P-channel transistors 1046 and 1048 and drive LC output 1036 and LCB output 1024 lines to Vcc.

Precharge circuit 1014 also comprises a current source (VCS) input 1051 to VCS generator comprising P-channel transistors 1052 and 1054. VCS generator provides a bleed current into LC line 1036 and LCB line 1024.

Sense amplifier 1012 comprises a reset/set (RS) latch. In one illustrative embodiment, RS latch is formed by a first and second cross-coupled two-input AND gates 1064 and 1066. First two-input NAND gate 1064 has a first input coupled to LC line 1036 from write amplifier circuit 1010 and precharge circuit 1014, a second input coupled to the output of second two-input NAND gate 1066 and an output coupled to a first input of second two-input NAND gate 1066 and inverter 1062. Second two-input NAND gate 1066 has a first input coupled to the output of first two-input NAND gate 1064, a second-input coupled to LCB line 1024 from either write amplifier circuit 1010 or precharge circuit 1014 and an output coupled to a second input of first two-input AND gate 1064. Inverter 1062 has and output coupled to data out line 1068.

Figure 11:
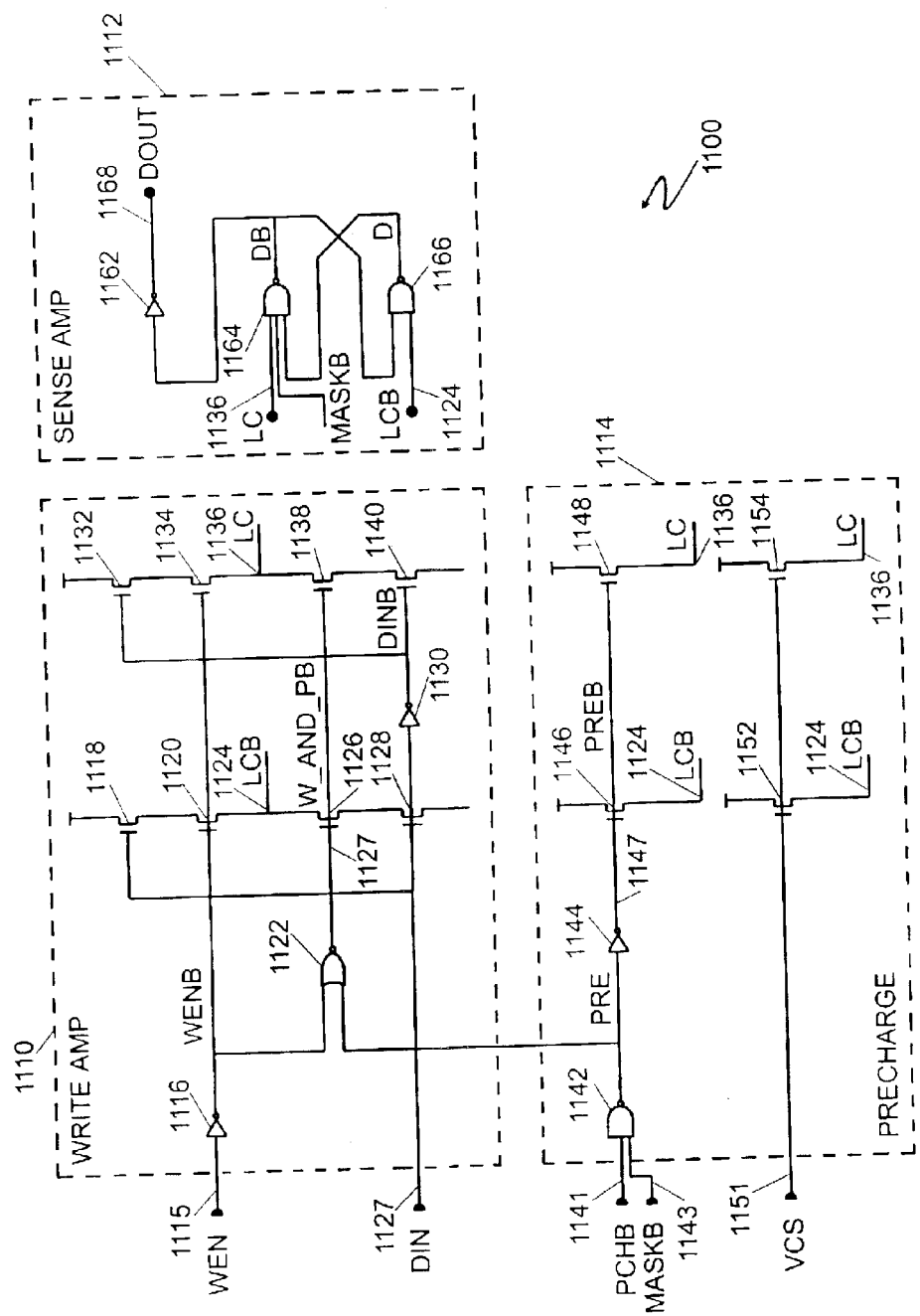
FIG. 11 is a simplified schematic diagram illustrating in greater detail the radiation tolerant read and write amplifiers as shown in FIG. 3 for user static random access (USRAM).

FIG. 11 is a simplified schematic diagram illustrating in greater detail the radiation tolerant read and write amplifiers as shown in FIG. 3 for user static random access (USRAM). Write amplifier 1110 comprises an enable input 1115 coupled to an inverter 1116. Inverter 1116 has an output coupled to the gate of P-channel transistors 1120 and 1134 and to two-input NOR gate 1122. Two-input NOR gate 1122 has a second input coupled to a first input 1141 of precharge circuit 1114 through two-input NAND gate 1142 and an output coupled to the gate of N-channel transistors 1126 and 1138. Write amplifier 1110 has a data input 1127 coupled to the gates of P-channel transistors 1118, 1132 and N-channel transistors 1128 and 1140.

Referring still to FIG. 11, P-channel transistor 1118 has a source coupled to Vcc and a drain coupled to the source of P-channel transistor 1120. P-channel transistor has a drain coupled to node comprising an output 1124. N-channel transistor 1126 has a drain coupled to node comprising an output 1124 and a source coupled to the drain of N-channel transistor 1128 that has a source coupled to ground. P-channel transistor 1132 has a source coupled to Vcc and a drain coupled to the source of P-channel transistor 1134. P-channel transistor has a drain coupled to node comprising an LCB output 1136. N-channel transistor 1138 has a drain coupled to node comprising an output 1136 and a source coupled to the drain of N-channel transistor 1140 that has a source coupled to ground.

Precharge circuit 1114 comprises a precharge input 1141 and a MASKB input 1143 coupled to two-input NAND gate 1142. Two-input NAND gate 1142 has an output coupled to an input of inverter 1144 which has an output coupled to the gate of P-channel transistors 1146 and 1148. P-channel transistor has a source coupled to Vcc and a drain coupled to LCB output 1124. P-channel transistor 1548 has a source coupled to Vcc and a drain coupled to LC output 1136.

Precharge periods occur between all read and write operations. For example, precharge input 1141 may be at logic 0 during precharging. When precharge input 1141 is at logic 0, the input of inverter 1144 is at logic 1 which forces node 1127 to logic 0 and disables write circuit 1110 pull-down transistors 1126 and 1138. When precharge input 1141 is at logic 0, it also forces node 1147 to logic 0 turning on the precharge P-channel transistors 1146 and 1148 and drive LC output 1136 and LCB output 1124 lines to logic 1.

MASKB input 1143, when asserted low, forces a value of logic 0 into sense amplifier 1112 and forces the precharge circuit into the precharge state as if precharge input 1141 had been asserted low. This masks the data sensed on LC/LCB because USRAM bits can change value after initial loading so they have to be masked during background ECC as is well known in the art. The USRAM bits in dynamic applications contain a logic 0 for refresh purposes regardless of the value initially loaded into a particular bit.

Precharge circuit 1514 also comprises VSC input 1151 to VCS generator comprising P-channel transistors 1152 and 1154. VCS generator provides a bleed current into LC line 1136 and LCB line 1124.

Sense amplifier 1112 comprises an RS latch. In one illustrative embodiment, RS latch is formed by a cross-coupled three-input NAND gate 1164 and two-input NAND gate 1166. Three-input NAND gate 1164 has a first input coupled to LC line 1136 from write amplifier circuit 1110 and precharge circuit 1114, a second input coupled to MASKB input line 1143 and a third input coupled to the output of two-input NAND gate 1166 and an output coupled to a first input of two-input NAND gate 1166 and inverter 1162. Two-input NAND gate 1166 has a first input coupled to the third output of three-input NAND gate 1164, a second input coupled to LCB line 1124 from either write amplifier circuit 1110 or precharge circuit 1114 and an output coupled to a third input of three-input NAND gate 1164. Inverter 1162 has and output coupled to data out line 1168.

Figure 12:
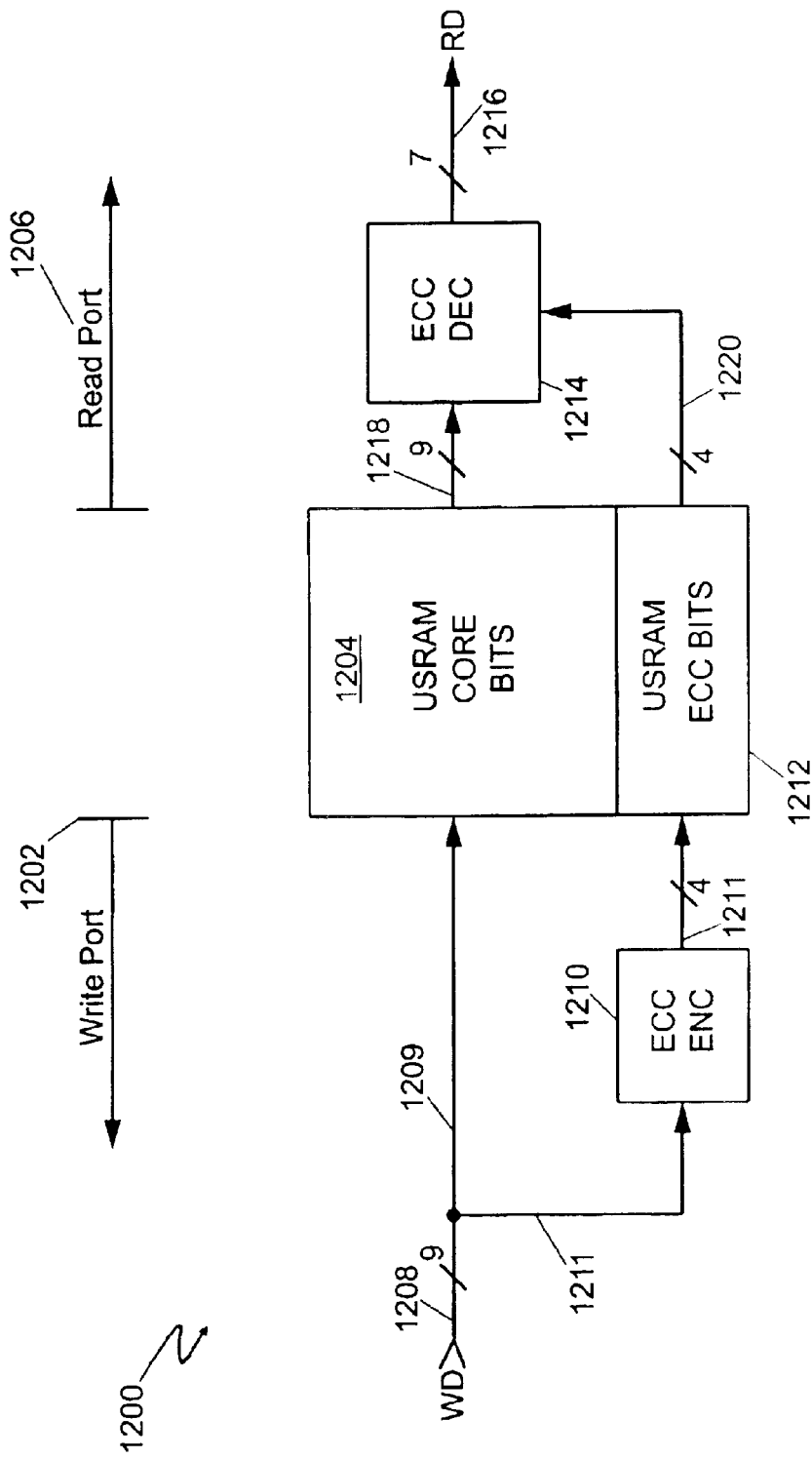
FIG. 12 is a simplified block diagram illustrating the USRAM circuit with the electronic correction code circuitry of the present invention.

FIG. 12 is a simplified block diagram illustrating the USRAM circuit 1200 with the electronic correction code circuitry (ECC) of the present invention. USRAM circuit 1200 comprises write port 1602 having an ECC encoder 1210 coupled to write data line 1208. Write data line 1208 is coupled to USRAM core 1204 via signal line 1209 and coupled via signal line 1211 to USRAM ECC through ECC encoder. ECC encoder generates check bits from the write data input line 1208 before a write operation takes place. Read port 1206 contains ECC decoder coupled to USRAM core via signal line 1218 and coupled via signal line 1220 to USRAM ECC. ECC decoder 1214 has an output coupled to read data line 1216. ECC decoder 1214 uses the stored data and check bits to make single corrections when necessary after a read operation. The read port ECC corrects the data as it leaves the USRAM block.

In static applications (AROM, etc.) masking is unnecessary. In dynamic applications (RAM. FIFO, etc.) masking is necessary.

From this disclosure, it will be apparent to persons of ordinary skill in the art that various alternatives to the embodiments of the disclosed system described herein may be employed in practicing the disclosed system. It is intended that the following claims define the scope of the disclosed system and that structures and methods within the scope of these claims and their equivalents be covered thereby.

What is claimed is:

1. A radiation tolerant programmable logic device comprising:
   logic modules;
   routing resources coupling said logic modules;
   configuration data lines having configuration data controlling said logic modules and said routing resources; and
   error correction circuitry coupled to said configuration data lines, wherein said error correction circuitry analyzes and corrects errors in said configuration data.

2. A radiation tolerant programmable logic device according to claim 1 wherein said error correction circuitry further comprises:
   a radiation tolerant read/write amplifier; and
   a radiation tolerant shift register coupled to said radiation tolerant read/write amplifier.

3. A radiation tolerant programmable logic device according to claim 2 wherein said wherein said error correction circuitry further comprises:

a voting block coupled between said radiation tolerant read/write amplifier and said configuration data line.

4. A radiation tolerant programmable logic device according to claim 3 wherein said wherein said error correction circuitry further comprises a plurality of latches having at least one transistor large enough to withstand a Qcnt or larger particle strike, said latches coupled to said voting block.

5. A radiation tolerant programmable logic device according to claim 1 wherein said wherein said error correction circuitry further comprises:
   a plurality of electronic code correction (ECC) latches each having a plurality of inputs and an output;
   a first multiplexer having an input and a plurality of outputs;
   a voting logic circuit having inputs coupled to at least one output of said plurality of ECC latches and coupled to at least one of said outputs of said multiplexer and said voting logic circuit having an output coupled to first input of a two-input multiplexer;
   a radiation tolerant shift register coupled to one of said plurality of outputs of said first multiplexer and an output coupled to a second input of said two-input multiplexer;
   a write latch having an input coupled to an output of said two-input multiplexer; and
   a read and write amplifier having an input coupled to an output of said write latch and at lease one of said plurality of outputs of said first multiplexer.

6. A radiation tolerant programmable logic device according to claim 5, wherein said voting logic circuit further comprises:
   three two-input AND gates; and
   a three-input AND gate having inputs coupled to an output of each of said three two-input AND gates.

7. A radiation tolerant programmable logic device according to claim 5, wherein said read and write amplifier further comprises:
   a write amplifier circuit having a plurality of inputs and a plurality of outputs;
   a precharge circuit coupled to said input of said write amplifier circuit and having a plurality of outputs; and
   a sense circuit having inputs coupled to said outputs of said write amplifier circuit and said outputs of said precharge circuit and having an output.

8. A radiation tolerant programmable logic device according to claim 5, wherein said ECC latches further comprise:
   a first transistor of a first nominal size having an source coupled to a first node forming an input to said ECC latch, a drain coupled to a second node and a gate coupled to a logic module signal line;
   a second transistor of a nominal size having an source coupled to said first node, a drain coupled to said second node and a gate coupled to an inverted logic module signal line;
   a first two-input NAND gate having a first input coupled to said second node and a second input coupled to a reset signal line;
   a second two-input NAND gate having a first input coupled to an output of first two-input NAND gate and a second input coupled to a set signal line and having an output to said output of said ECC latch;
   a third transistor of second larger size having a source coupled to a third node, a drain coupled to a fourth node and a gate coupled to a second logic module signal line; and
   a fourth transistor of second larger size having a source coupled to said third node, said third coupled to said output of said second two-input NAND gate, a drain coupled to said forth node, said fourth node coupled to said first input of said first two-input NAND gate, and a gate coupled to a second inverted logic module signal line.

9. A method for correcting errors in a programmable logic device having configuration data to program the programmable logic device, said method comprising:
   background reading of the configuration data;
   analyzing said configuration data for errors;
   correcting said configuration data if errors are located; and
   re-writing said configuration data if errors are located.

10. The method of claim 9 where said analyzing of said configuration data for errors is accomplished with voting logic.

* * * * *